(12) United States Patent
Frisch

(10) Patent No.: US 7,265,983 B2
(45) Date of Patent: Sep. 4, 2007

(54) POWER UNIT COMPRISING A HEAT SINK, AND ASSEMBLY METHOD

(75) Inventor: Michael Frisch, Munich (DE)

(73) Assignee: Tyco Electronics Raychem GmbH, Ottobrunn (DE)

( * ) Notice: Subject to any disclaimer, the term of this patent is extended or adjusted under 35 U.S.C. 154(b) by 319 days.

(21) Appl. No.: 10/958,614

(22) Filed: Oct. 5, 2004

(65) Prior Publication Data

US 2005/0105277 A1    May 19, 2005

(30) Foreign Application Priority Data

Oct. 13, 2003    (EP) .................................. 03023199

(51) Int. Cl.
*H05K 7/20* (2006.01)
*F28F 7/00* (2006.01)

(52) U.S. Cl. ..................... 361/719; 165/80.3; 165/185; 361/704; 361/710

(58) Field of Classification Search ................. 361/719
See application file for complete search history.

(56) References Cited

U.S. PATENT DOCUMENTS

| | | | |
|---|---|---|---|
| 5,113,315 A | 5/1992 | Capp et al. | |
| 5,172,301 A * | 12/1992 | Schneider | ................... 361/717 |
| 5,258,239 A | 11/1993 | Kobayashi | |
| 5,463,250 A * | 10/1995 | Nguyen et al. | ............. 257/698 |
| 5,920,458 A * | 7/1999 | Azar | ........................... 361/704 |
| 6,058,013 A * | 5/2000 | Christopher et al. | ........ 361/704 |
| 6,411,516 B1 | 6/2002 | Palumbo et al. | |
| 6,446,709 B1 | 9/2002 | Huang | |
| 6,706,972 B1 * | 3/2004 | Martin | ....................... 174/260 |
| 2001/0050843 A1 | 12/2001 | Ueno et al. | |

FOREIGN PATENT DOCUMENTS

| | | |
|---|---|---|
| DE | 4335525 A1 | 4/1995 |
| DE | 19532992 A1 | 3/1997 |
| DE | 102 50 604 A1 | 4/2004 |
| EP | 0061518 A1 | 10/1982 |

* cited by examiner

*Primary Examiner*—Gregory D Thompson
(74) *Attorney, Agent, or Firm*—Barley Snyder LLC

(57) ABSTRACT

The present invention relates to a power unit comprising at least one power electronics module, a circuit carrier, which is connected to said power electronics module, and at least one heat sink, which is connected to said power electronics module, in order to dissipate heat. The invention also relates to an associated heat sink and a corresponding assembly method. In order to provide a power unit and an associated assembly method which allows improved dissipation of air heat, as well as adequate electrical insulation of the power modules and simplified implementation, the circuit carrier comprises at least one through hole. At least one contact extension located on the heat sink, which is at least partially received by the through hole. The contact extension of the heat sink is thermally contacted with the power electronics module by means of a heat-conductive material.

18 Claims, 2 Drawing Sheets

POWER UNIT COMPRISING A HEAT SINK, AND ASSEMBLY METHOD

FIELD OF THE INVENTION

The present invention relates to a power unit comprising at least one power electronics module, a circuit carrier, which is connected to said power electronics module and at least one heat sink, which is connected to the power electronics module, in order to dissipate heat. The invention also relates to an associated heat sink and a corresponding assembly method.

BACKGROUND

Power units are often operated for brief periods or intermittently at very high power, in particular in applications such as servo drives, soft starters, cranes or lifting devices, as well as welding devices. There is therefore a need for heat sinks that reliably protect the semiconductors from overheating, even during peak loads. Adequate heat dissipation is essential during intermittent operation, since not only must the maximum junction temperature not be exceeded, but care must also be taken, for reasons relating to the service life, that the temperature does not vary excessively.

In the past, semiconductors and other electrical components, such as power resistors or the like, have been assembled on substrates that are both electrically insulating and good heat conductors, such as a direct bonded copper (DBC) or insulated metal substrate (IMS). When discrete, non-insulating components are used, the electrical contact is conventionally produced by soldering into a circuit board, and the thermal coupling, which is required in order to dissipate the heat, is produced by pressing the substrate against a heat sink. The electrical insulation between the component and the heat sink is eliminated by foils which conduct heat but not electricity.

This technique has the drawback, however, that foils of this type, on the one hand, are relatively expensive and, on the other hand, entail an additional assembly step.

DE 102 50 604.3 discloses an integrated circuit system comprising a latent heat storage unit, wherein, in order to improve heat dissipation, the power electronic modules are assembled directly on heat sink elements, which, on the one hand, dissipate the heat into a latent heat storage medium and, on the other hand, provide electrical contact.

Although this solution allows complicated electrical insulation between the heat sink and the power electronic modules to be dispensed with, it has the serious drawback that, because of the absence of a substrate that is compatible with standard procedures, both the overall structure and the assembly technique are comparatively problematic.

SUMMARY

It is therefore an object of the present invention to provide a power unit, a heat sink and an associated assembly method which facilitates improved dissipation of heat, as well as adequate electrical insulation of the power modules and simplified implementation.

This and other objects are achieved by a power unit, a heat sink, and an assembly method based on the idea of dissipating heat on a heat sink via contact extensions of the heat sink that are thermally connected to the power electronics module through holes running through the substrate. This solution according to the invention can simplify the power unit and the production thereof considerably, since, on the one hand, there is no need for electrical insulation between the component and the heat sink and, on the other hand, the thermal contacting of the component to the heat sink is compatible with standard SMD (surface mount device) technologies. As the substrate is not required for the thermal coupling, its configuration is not essential for dissipating the heat of the components. Expensive heat-conductive substrates can, in particular, be dispensed with.

The present invention therefore eliminates the need for expensive power substrates, insulated components and expensive insulating foils. Procedure steps such as screwing or clamping the components to a heat sink, are also not required for the heat coupling.

BRIEF DESCRIPTION OF THE DRAWINGS

The invention will be illustrated below in greater detail, with reference to the configurations shown in the accompanying drawings. In the figures, similar or corresponding individual parts are provided with the same reference numerals. In the drawings.

DETAILED DESCRIPTION OF THE EMBODIMENT(S)

Figure 1:
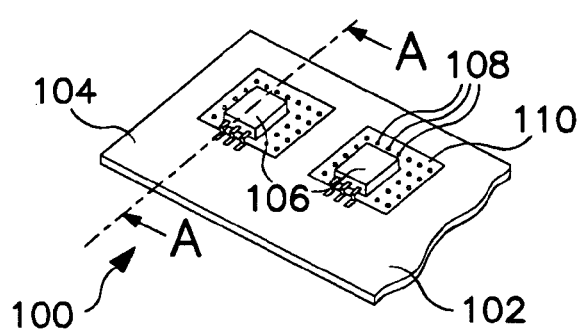
FIG. 1 shows a perspective view of a power unit according to the present invention.

FIG. 1 shows a perspective illustration of the power unit 100 of the invention, according to a first embodiment. FIG. 1 also shows the upper side 104 of the circuit carrier 102, on which the power electronics modules 106 are assembled.

According to the invention, the circuit carrier, in this case a printed circuit board (PCB) 102, comprises a large number of through hole connections 108, which are known as vias. As is the case with standard through hole connections, these through hole connections 108 contain a heat-conductive material such as a metallization layer on their interior wall and are in contact with a thermally conductive coating such as a metallized bearing surface 110. According to the invention, the through hole connections 108 are used for thermally contacting the modules 106 with associated heat sinks, as will be illustrated in greater detail with reference to FIG. 3.

Figure 2:
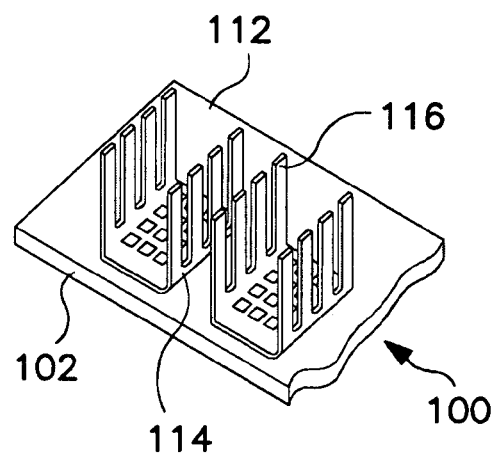
FIG. 2 shows a perspective view, rotated by 180°, of the power unit from FIG. 1.

FIG. 2 shows a view, rotated by 180°, of the power unit 100. According to the invention, heat sinks 114 are arranged on the lower side 112. As the heat sinks 114 are not electrically insulated with respect to the power electronics modules 106, which are configured as SMD components, an individual heat sink 114 is provided for each module 106, in order to ensure the potential separation. The heat sinks 114 are made from metal, by stamping and forming and comprise a large number of cooling vanes 116, which facilitate the dissipation of heat into the environment.

Figure 3:
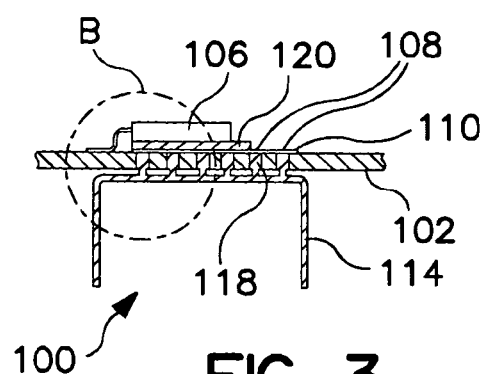
FIG. 3 shows a section through the power unit of FIG. 1, along the line A-A.

FIG. 3 shows a section through the power unit 100 of FIG. 1, along the line A-A. This sectional view illustrates the thermal contacting between the heat sink 114 and the power electronics module 106. According to the invention, the heat sink 114 comprises a large number of contact extensions 118, which dip into the through hole connections 108 in a finger-like manner. The contact extensions 118 enter into contact with the power electronics module 106 through the metallization of the through hole connections 108 and the metallized bearing surface 110 on the surface of the circuit carrier 102. The contact extensions 118 are press-fitted into the through hole connections 108 to ensure effective heat transfer. In addition, in the illustrated embodiment, the flow-soldering step, by means of which the power electronics modules 106 produced using SMD technology are electrically contacted, is used for additional thermal contacting between the contact extensions 118 and the electrically conductive lower side 120 of the power electronics modules 106.

Figure 4:
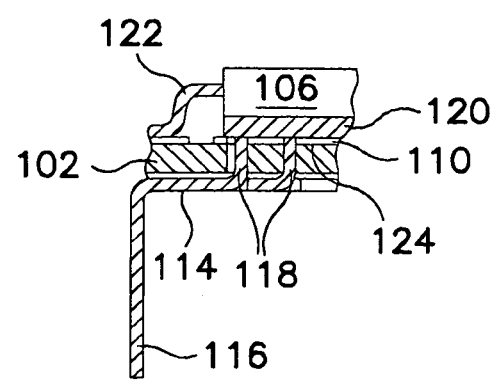
FIG. 4 shows an enlarged detail B from FIG. 3.

As the thermal contacting between the heat sink 114 and the module 106 is produced directly through the circuit board, standard PCB laminate circuit boards, of fire-retardant category 4, FR4, for example, may be used as circuit carriers 102. With regard to the other requirements, however, any circuit carriers may be used. FIG. 4 shows detail B from FIG. 3. This view also illustrates the potential separation between the metallized lower side of the module 106 and the terminals 122. In order to provide more extensive electrical insulation between the metallized bearing surface 110 and the terminals 122 and also to allow adequate protection from environmental influences, such as moisture, all of the power unit 100 according to the invention may be covered with an insulating varnish, by means of immersion, for example. A soldering layer 124, which, like the electric terminals, is produced using the reflow method, is provided in order to ensure secure mechanical stability and optimal thermal contacting.

A method according to the invention for assembling a power electronics module 100 according to the present invention will be illustrated below with reference to FIGS. 1 to 4.

First of all, a heat sink 114 is pressed, for each power electronics module, into through hole connections 108 provided for this purpose on a circuit carrier 102, an FR4-PCB, for example, starting from the back. Contact extensions 118, which are molded onto the heat sink 114, are at least partially received by the through hole connections 108. Subsequently, the SMD power electronics modules 106 are assembled on the opposite, upper side of the circuit carrier 102. A first thermal contact is thus produced between the contact extensions 118 of the heat sinks 114, through the metallization of the through hole connections 108, a metallized region 110 on the upper side of the circuit carrier and a metallic coating 120 on the back of the power electronics module 106. By soldering the SMD components to the finger-shaped contact extensions 118, the thermal coupling may also improve heat transfer. Said soldering takes place simultaneously with the conventional SMD soldering process, in which the electrical contact of the terminals 122 with associated conducting paths is produced. In a final spraying, immersion or casting step, all of the completed module, including the heat sinks, may be protected from environmental influences, such as moisture, by an insulating varnish.

Figure 5:
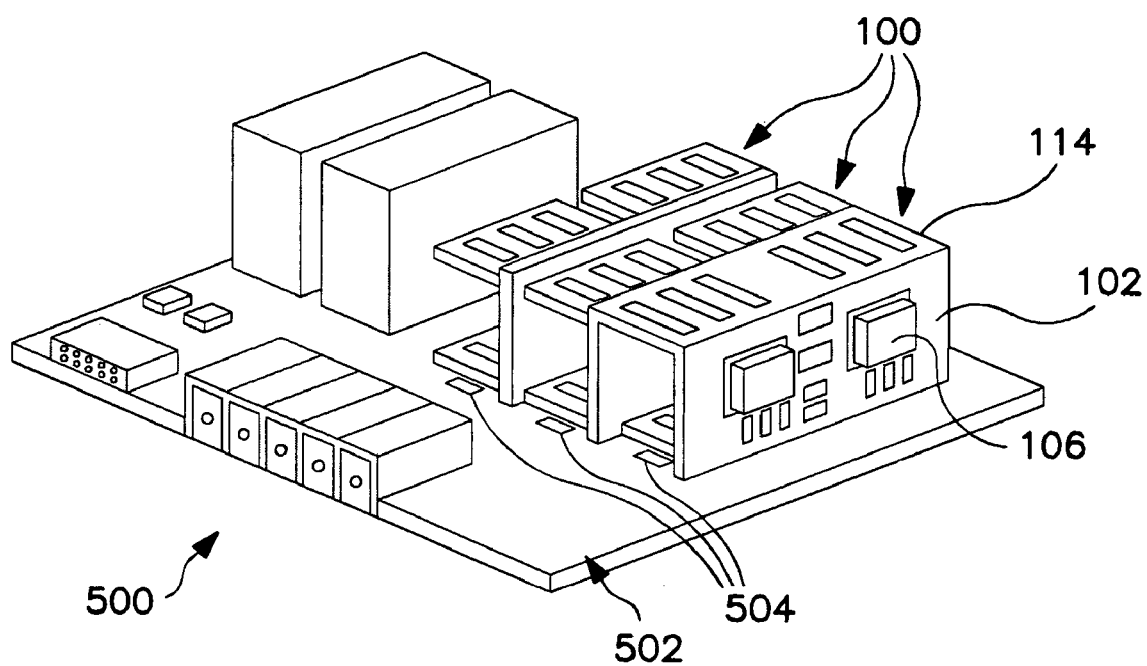
FIG. 5 shows a perspective illustration of a converter module for a motor control unit, comprising a plurality of power units according to the present invention.

The invention may generally be used for the construction of power applications. Particular advantages emerge for applications wherein a fan may be used for cooling. As an example of a particular application of the invention, FIG. 5 shows a converter module 500 for a motor control unit. A total of three power units 100 are constructed as sub-modules on a system board 502. Any required number of power units 100 can, of course, be used. Two discrete SMD power modules 106, each with its own heat sink 114, are assembled on the three sub-modules 100 shown here. Said power units 100 are soldered into the system board 502 using a so-called "board-in-board" technique. For the purposes of mechanical attachment, the heat sinks 114 may be configured such that they may be soldered through associated holes in the system board 502, through hole connection corresponding soldered joints 504. Alternatively, a screw connection is also conceivable.

The individual sub-modules, or even the entire converter module 500, may easily be protected from environmental influences, by means of a varnishing step. In this case, the heat sinks 114 are also varnished, without significantly impairing their thermal properties. At high powers, it may be beneficial to cool the arrangement, using a fan.

The present invention may be used in a large number of fields of application, such as in electronics for powering washing machines or air-conditioning equipment, as well as in the associated field of continuous power supply.

Advantageously, the heat sink 114 may be thermally coupled to the power electronics module 106 by a metallization layer, which both partially lines the through hole 108 in the circuit carrier 102 and is in contact with the module 106. This kind of metallization of through hole connections in a contact carrier 102, in the form of what are known as vias 108, is a standard procedure step that is in any case required in the majority of electrical through hole connections. The heat sink 114 may be configured with said metallization layer by pressing the contact extension 118 into the through hole 108. It is advantageous that a separate procedure step is not required for the thermal contacting.

Additionally or alternatively, the at least one contact extension 118 of the heat sink 114 may be thermally connected to the power electronics module 106 via a soldered joint. This allows heat to be dissipated in a particularly reliable manner and can be carried out without additional procedure steps, in particular if the power components are SMD components, which are in any case reflow soldered. The procedure step of electrical contacting using an SMD soldering method is therefore used simultaneously to solder the contact extensions, protruding through the through hole connections, of the heat sinks 114 to the SMD components. This also improves the heat transfer.

A thermally conductive coating, preferably a metallization layer, which is applied to the surface of the circuit carrier 102 that faces the power electronics module 106 and abuts a thermally conductive layer on the back of the power electronics module, also improves the heat transfer.

In order to dissipate heat into the environment, the heat sink 114 may also comprise at least one cooling vane 116. A cooling vane 116 of this type is particularly advantageous in combination with a fan.

The advantageous properties of the power unit according to the invention are particularly apparent if the power unit is used in a converter module, and is connected to a system board of said converter module. This allows a large number of such power units to be assembled on the system board and to be additionally cooled, using a fan, for example.

What is claimed is:

1. A Power unit having at least one power electronics module, which is assembled on a circuit carrier having at least one through hole, and at least one heat sink, which is connected to the power electronics module in order to dissipate heat, the power unit comprising:

at least one contact extension located on the heat sink, which is at least partially received by the through hole, the contact extension being thermally and electrically contacted with the power electronics module by means of a heat-conductive material which at least partially lines the at least one through hole in the circuit carrier; and at least one cooling vane protruding from the heat sink and extending generally away from the circuit carrier, the at least one cooling vane being electrically connected to the power electronics module at least partially via the heat-conductive material.

2. The power unit according to claim 1, wherein the heat-conductive material comprises a metallization layer.

3. The power unit according to claim 2, wherein the heat-conductive material comprises a solder.

4. The power unit according to claim 3, wherein the circuit carrier comprises a thermally conductive coating, on the surface facing the power electronics module, which abuts a thermally conductive layer on the back of the power electronics module.

5. The power unit according to claim 4, wherein the heat sink is made from metal, by stamping and forming.

6. The power unit according to claim 5, wherein a large number of power electronic modules, each of which is connected to a separate heat sink, is arranged on the circuit carrier.

7. The power unit according to claim 6, wherein an electrically insulating varnish is applied to at least a portion of the power unit.

8. The power unit according to claim 1, wherein the power unit is connected to a system board of the converter module.

9. The power unit according to claim 8, wherein a second electrically insulating varnish is applied to at least a portion of the converter module.

10. A heat sink for a power electronics module which is assembled on a circuit carrier, wherein the heat sink may be thermally connected to the power electronics module, in order to dissipate heat, and the circuit carrier has at least one through hole, the heat sink comprising:

at least one contact extension which may be received at least partially by the through hole, and which may be thermally and electrically contacted with the power electronics module by a heat-conductive material which at least partially lines the at least one through hole in the circuit carrier; and at least one cooling vane protruding from the heat sink and extending generally away from the circuit carrier, the at least one cooling vane being electrically connected to the power electronics module at least partially via the heat-conductive material.

11. The heat sink according to claim 10, wherein the heat sink is made from metal, by stamping and forming.

12. A method for assembling a power electronics module, comprising the steps of:

assembling at least one heat sink on a first side of a circuit carrier, wherein at least one contact extension, which is located on the heat sink, is at least partially received in a corresponding through hole in the circuit carrier and wherein at least one cooling vane, which protrudes from the heat sink, extends generally away from the circuit carrier and is electrically connected to the power electronics module; and assembling at least one power electronics module on a side opposite the first side of the circuit carrier, so that the at least one contact extension is thermally and electrically connected to the power electronics module;

wherein the at least one contact extension is pressed into a thermally conductive coating, which at least partially lines the through hole in the circuit carrier; and wherein the at least one cooling vane is electrically connected to the power electronics module at least partially via the thermally conductive coating.

13. The method according to claim 12, further comprising the step of:

soldering the contact extensions with a thermally conductive layer on the back of the power electronics module.

14. The method according to claim 13, further comprising the step of:

covering at least a part of the power unit with an electrically insulating varnish.

15. A Power unit having at least one power electronics module, which is assembled on a circuit carrier having at least one through hole, and at least one heat sink, which is connected to the power electronics module in order to dissipate heat, the power unit comprising:

at least one contact extension located on the heat sink, which is at least partially received by the through hole, the contact extension being thermally contacted with the power electronics module by means of a heat-conductive material; and at least one cooling vane protruding from the heat sink and extending generally away from the circuit carrier;

wherein the heat-conductive material comprises a solder and a metallization layer, which at least partially lines the at least one through hole in the circuit carrier; and wherein the circuit carrier comprises a thermally conductive coating, on the surface facing the power electronics module, which abuts a thermally conductive layer on the back of the power electronics module.

16. The power unit according to claim 15, wherein the heat sink is made from metal, by stamping and forming.

17. The power unit according to claim 16, wherein a large number of power electronic modules, each of which is connected to a separate heat sink, is arranged on the circuit carrier.

18. The power unit according to claim 17, wherein an electrically insulating varnish is applied to at least a portion of the power unit.

* * * * *